(12) United States Patent
Cho

(10) Patent No.: US 7,211,491 B2
(45) Date of Patent: May 1, 2007

(54) METHOD OF FABRICATING GATE ELECTRODE OF SEMICONDUCTOR DEVICE

(75) Inventor: Yong Soo Cho, Daejeon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 309 days.

(21) Appl. No.: 11/026,287

(22) Filed: Dec. 30, 2004

(65) Prior Publication Data

US 2005/0142823 A1 Jun. 30, 2005

(30) Foreign Application Priority Data

Dec. 31, 2003 (KR) .................... 10-2003-0102034

(51) Int. Cl.
*H01L 21/336* (2006.01)

(52) U.S. Cl. .................... 438/305; 438/589; 438/595; 257/330; 257/332; 257/336; 257/344; 257/E21.435; 257/E21.438

(58) Field of Classification Search ................ 438/589, 438/595, 592, 303, 226, 307, 305, 306, 231; 257/330, 332, 336, 344, E21.435, E21.438, 257/E29.266, E29.278

See application file for complete search history.

(56) References Cited

U.S. PATENT DOCUMENTS

| | | | | |
|---|---|---|---|---|
| 5,391,912 | A * | 2/1995 | Horiuchi et al. | 257/588 |
| 5,879,998 | A * | 3/1999 | Krivokapic | 438/300 |
| 6,303,448 | B1 * | 10/2001 | Chang et al. | 438/300 |
| 6,319,783 | B1 * | 11/2001 | Ang et al. | 438/300 |
| 6,326,272 | B1 * | 12/2001 | Chan et al. | 438/300 |
| 6,423,618 | B1 * | 7/2002 | Lin et al. | 438/589 |
| 6,429,055 | B2 * | 8/2002 | Oh | 438/149 |
| 6,492,696 | B2 * | 12/2002 | Morimoto et al. | 257/412 |
| 6,537,885 | B1 | 3/2003 | Kang et al. | |
| 6,566,198 | B2 * | 5/2003 | Park et al. | 438/259 |
| 6,878,599 | B2 * | 4/2005 | Inaba | 438/305 |
| 6,887,760 | B2 * | 5/2005 | Curro' et al. | 438/268 |
| 6,930,030 | B2 * | 8/2005 | Rausch et al. | 438/589 |
| 6,936,507 | B2 * | 8/2005 | Tang et al. | 438/197 |
| 6,939,751 | B2 * | 9/2005 | Zhu et al. | 438/151 |

(Continued)

OTHER PUBLICATIONS

Shigeaki Zaima, Jun Kojima, Hideaki Shinoda and Yukio Yasuda; Electrical Properties in Metal/Si1-xGex/Si (100) Contacts; In Advanced Metallization and Interconnect Systems for ULSI Applications in 1996; Copyright 1997 by Materials Research Society, Pittsburgh PA; pp. 223-228.

*Primary Examiner*—M. Wilczewski
(74) *Attorney, Agent, or Firm*—Andrew D. Fortney

(57) ABSTRACT

A method of fabricating a gate electrode of a semiconductor device is disclosed. A disclosed method comprises growing a silicon epitaxial layer on a silicon substrate; making at least one trench through the epitaxial layer and filling the trench with a first oxide layer; etching the first oxide layer to form reverse spacers in the trench; depositing a second oxide layer and a polysilicon layer over the silicon substrate including the trench and the reverse spacers and forming a gate; implanting ions in the silicon substrate at both sides of the gate to form pocket-well and LDD areas; depositing a nitride layer over the silicon substrate including the gate and etching the nitride layer to form spacers; implanting ions using the spacers and the gate as a mask to make a source/drain region; and forming a silicide layer on the top of the gate electrode and the silicon epitaxial layer positioned on the source/drain region.

5 Claims, 2 Drawing Sheets

U.S. PATENT DOCUMENTS 6,958,272 B2 * 10/2005 Lingunis et al. ............ 438/257
7,122,431 B2 * 10/2006 Kim et al. .................. 438/259
7,125,779 B2 * 10/2006 Inaba ......................... 438/305
2002/0048918 A1 * 4/2002 Grider et al. ............... 438/592

* cited by examiner

METHOD OF FABRICATING GATE ELECTRODE OF SEMICONDUCTOR DEVICE

BACKGROUND OF THE INVENTION

1. Field of the Invention

The present invention relates to a method of fabricating a gate electrode of a semiconductor device and, more particularly, to a method of making a nanoscale gate channel by forming reverse spacers and creating shallow junction structures by forming an elevated source/drain using a silicon epitaxial layer.

2. Background of the Related Art

The size of a metal-oxide-metal (hereinafter referred to as "MOS") transistor has been gradually reduced as semiconductor devices become highly integrated. The width of a gate electrode and the area of a source/drain region are shrunken in proportion to decreasing size of the MOS transistor and, therefore, the contact resistance of the source/drain region as well as the resistance of the gate electrode are increased. Moreover, the source/drain region in a MOS transistor of a high-integrated semiconductor device has to be formed so that it has a shallow junction to avoid short channel effect. However, if the junction of the source/drain region becomes shallow in depth, the junction leakage current characteristics deteriorates and, therefore, the resistance of the source/drain region increases. In recent years, a method of reducing the contact resistance of metal interconnect lines by bringing a material layer such as a SiGe layer, which has a lower band gap energy than that of silicon, into contact with a metal interconnect line has been presented (*Materials Research Society*, pp. 223~228, Shigeaki Zaima et al., 1997.).

On the other hand, it is generally known that a transistor fabrication method uses a salicide process to reduce the resistance of gate electrodes and the contact resistance of source/drain regions. However, in making a small-size MOS transistor of a high-integrated semiconductor device, the salicide process may deteriorate more seriously the junction leakage current characteristics of the source/drain region. To avoid this problem, a method using an elevated source/drain technology together with the salicide technology has been presented to reduce the resistance of gate electrodes and source/drain regions at the same time for the purpose of improving the junction leakage current characteristics. Here, the elevated source/drain technology forms a SiGe layer on the source/drain region using a selective epitaxial growth (hereinafter referred to as "SEG") process.

For example, U.S. Pat. No. 6,537,885, Kang et al., describes a method of manufacturing a transistor having a shallow junction formation. Kang et al. uses two layers of a silicon epitaxial layer to fabricate a transistor having a good short channel effect and good drive current.

FIG. 1 is a cross-sectional view illustrating a transistor with an elevated source/drain formed by a conventional fabrication method. As shown in FIG. 1, a gate insulation layer 3 such as a thermal oxide layer is formed on a predetermined area in a semiconductor substrate 1 with a first conduction-type. Then, a gate pattern 5 is formed on the gate insulation layer 3. The semiconductor substrate is made of single crystal silicon. The gate pattern is a doped polysilicon layer. In another embodiment, the gate pattern may consist of a doped polysilicon layer and a capping layer. The capping layer is a silicon nitride layer or silicon oxide layer. Next, spacers 9 made of an insulating material such as silicon oxide or silicon nitride are formed on the sidewalls of the gate pattern. A source/drain region 13 with a second conduction-type is then formed on the surface of the substrate at both sides of a channel area under the gate pattern. The source/drain region is a lightly doped drain (hereinafter referred to as "LDD") type. The second conduction-type is opposite to the first conduction-type. Then, a SiGe layer 15 doped with impurities is selectively formed on the source/drain region. Here, the SiGe layer 15 has the same conduction-type as the source/drain region. A metal silicide layer 17a is then formed on the SiGe layer. Here, if the gate pattern is a doped polysilicon layer, the SiGe layer and the metal silicide layer are also formed on the gate pattern in sequence. As a result, an elevated source/drain consisting of the source/drain region and the SiGe layer are completed, as shown in FIG. 1. Here, the metal silicide layer is a layer consisting of silicon and a fireproof metal such as cobalt, tantalum, or titanium. The metal silicide layer has lower specific resistance than that of the source/drain region 13 doped with impurities. In addition, the SiGe layer positioned between the metal silicide layer and the source/drain region has a lower band gap energy than that of the silicon substrate.

By adopting the elevated source/drain structure, the above-described prior art can increase the distance between the metal silicide layer and the junction area of the source/drain region in a MOS transistor while the low junction depth of the source/drain region is maintained. Accordingly, the leakage current characteristics of the source/drain region as well as the short channel effect of the MOS transistor can be improved. However, the described prior art includes the epitaxial layer made of a different material from the silicon substrate, which has to be selectively deposited over a source/drain region. Moreover, the epitaxial layer has additionally to be doped with the same impurities as those doped into the source/drain region. Therefore, the process for fabricating a transistor becomes complicated.

SUMMARY OF THE INVENTION

Accordingly, the present invention is directed to a method of fabricating a gate electrode of a semiconductor device that substantially obviates one or more problems due to limitations and disadvantages of the related art.

An object of the present invention is to provide a method of fabricating a nano-scale gate channel by forming reverse spacers and creating shallow junction structure by forming an elevated source/drain using a silicon epitaxial layer. As an embodiment of the present invention, a method of fabricating a gate electrode of a semiconductor device comprises:

growing a silicon epitaxial layer on a silicon substrate;

making at least one trench through the epitaxial layer and filling the trench with a first oxide layer;

etching the first oxide layer to form reverse spacers in the trench;

depositing a second oxide layer and a polysilicon layer over the silicon substrate including the trench and the reverse spacers and removing some part of the second oxide layer and the polysilicon layer to form a gate;

implanting ions into the silicon substrate at both sides of the gate to form pocket-well and LDD areas;

depositing a nitride layer over the silicon substrate including the gate and etching the nitride layer to form spacers;

implanting ions using the spacers and the gate as a mask to make a source/drain region; and forming a silicide layer on the top of the gate electrode and the silicon epitaxial layer positioned on the source/drain region.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Reference will now be made in detail to the preferred embodiments of the present invention, examples of which are illustrated in the accompanying drawings.

Figure 1:
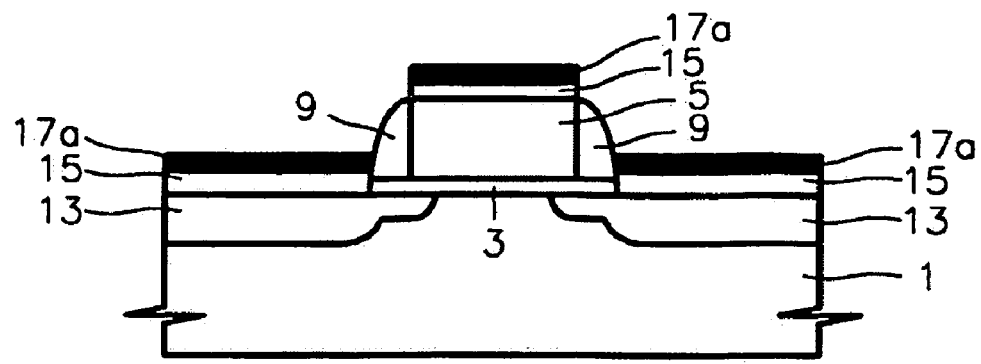
FIG. 1 illustrates, in a cross-sectional view, elevated source/drain structure in accordance with a prior art.
Figure 2A:
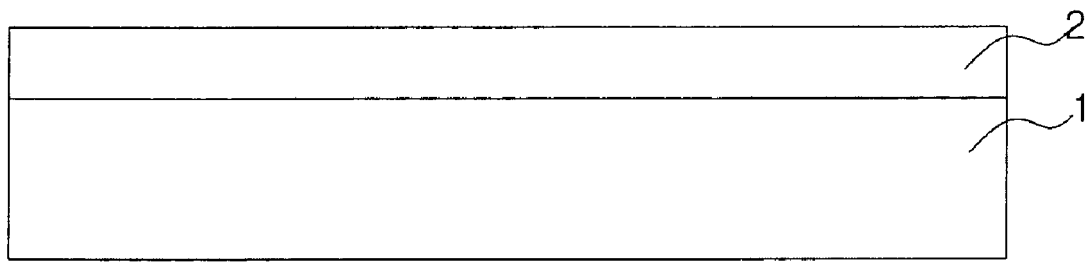
FIGS. 2a through 2d illustrate, in cross-sectional views, process steps for forming a gate electrode having reverse spacers according to the present invention.

Referring to FIG. 2a, a silicon epitaxial layer 2 is grown over a silicon substrate 1.

Figure 2B:
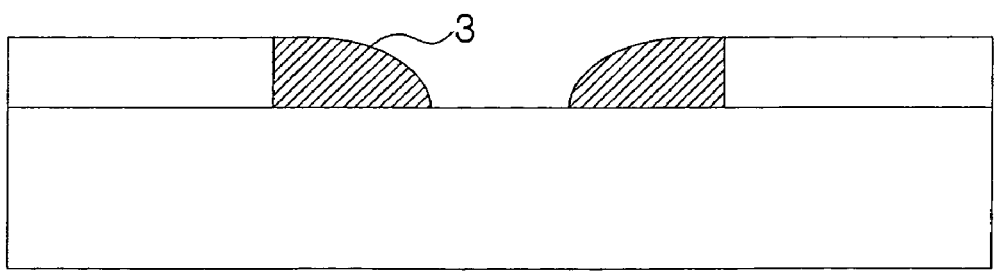

Referring to FIG. 2b, at least one trench with a predetermined width is formed through the epitaxial layer. The trench is then filled with an insulating layer. Next, the insulating layer is dry-etched to form reverse spacers on the sidewalls of the trench. Here, the width of the trench is larger than that of a gate to be formed in the following process. The insulating layer is preferably a layer of tetraethylorthosilicate (hereinafter referred to as "TEOS") or a multi-layer of TEOS—SiN—TEOS.

Figure 2C:
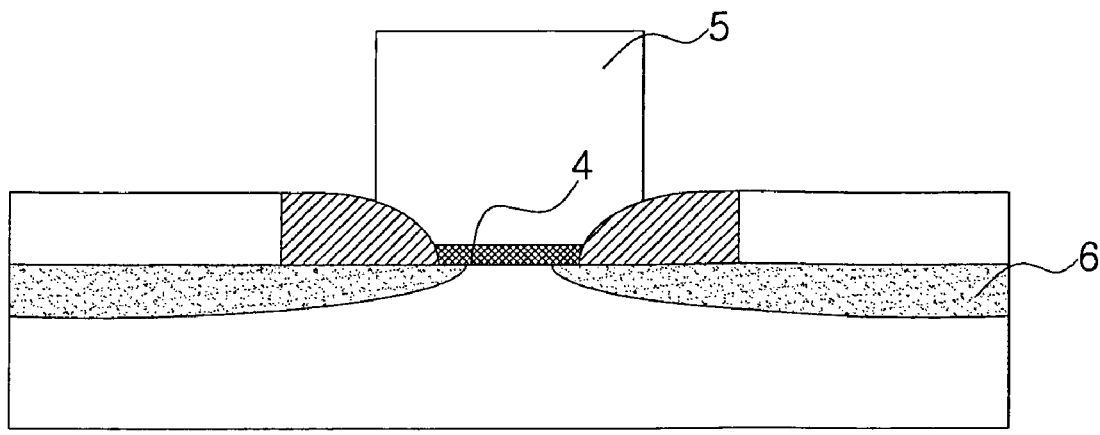

Referring to FIG. 2c, an oxide layer 4 and a polysilicon layer 5 are deposited over the silicon substrate including the trench and the reverse spacers. The oxide layer 4 and the polysilicon layer 5 are patterned and dry-etched to form a gate. Here, the width of the formed gate is smaller than that of the trench and larger than the spacing between the reverse spacers. The length of a channel area formed under the gate electrode in the silicon substrate is defined by the spacing between the reverse spacers. Accordingly, the width of the formed channel is smaller than that of a channel defined by a conventional gate electrode. This process can be utilized for a transistor process smaller than 90 nm in size.

Next, an ion implantation process is performed to form pocket-well areas (not shown) and LDD areas 6. In a conventional process, the ions have to be implanted at a low energy level in order to form shallow junction to prevent the leakage current of a junction area. However, the process according to the present invention can form the shallow junction although the ions are implanted at a high energy level because the silicon epitaxial layer on the top of the silicon substrate can play a role of a buffer layer.

Figure 2D:
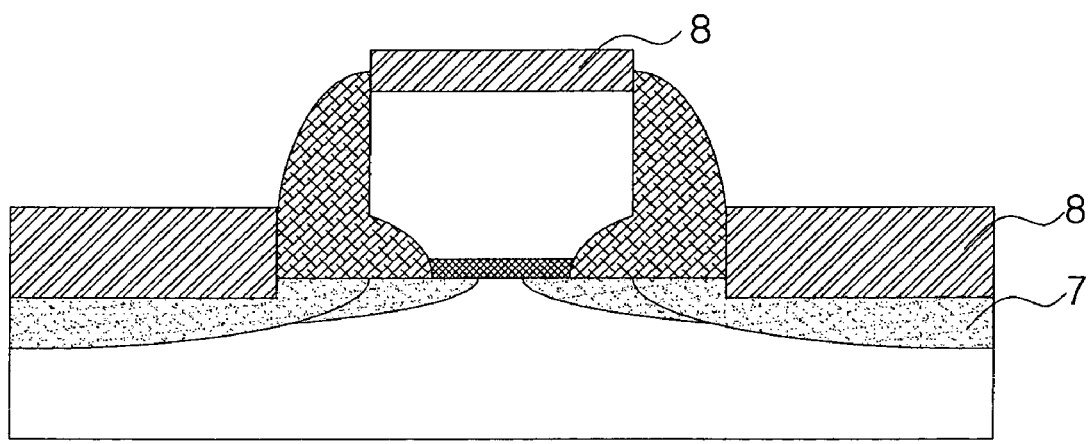

Referring to FIG. 2d, a nitride layer is deposited over the silicon substrate including the gate electrode. The nitride layer is etched to form spacers on the sidewalls of the gate electrode. Then, an ion implantation process is performed using the spacers and the gate as a mask to form a deep source/drain region 7. Here, the ions are implanted into the silicon epitaxial layer on the source/drain region at the same time and, therefore, an elevated source/drain can be formed. The elevated source/drain structure can provide the shallow junction necessarily required in the design of a nanoscale transistor and resolve the problem of parasitic resistance. After the ion implantation, a silicide layer is formed on the top of the gate electrode and the source/drain region by a known process.

Accordingly, the method disclosed herein can create a nanoscale gate channel by forming reverse spacers and the shallow junction structure by forming an elevated source/drain using a silicon epitaxial layer.

Moreover, the above-described method of fabricating a nanoscale transistor using reverse spacers and an epitaxial layer can simplify the manufacturing process and reduce the production costs because it adopts an existing gate process technology. In other words, because the same silicon epitaxial layer as the silicon substrate is grown on the silicon substrate before a source/drain region is formed and an ion implantation process is performed for both source/drain region and epitaxial layer, this method can embody the simplification of process compared to the SEG process requiring an additional ion implantation process.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of fabricating a gate electrode of a semiconductor device comprising the steps of:
   growing a silicon epitaxial layer on a silicon substrate;
   making at least one trench through the epitaxial layer and filling the trench with a first oxide layer;
   etching the first oxide layer to form reverse spacers in the trench;
   depositing a second oxide layer and a polysilicon layer over the silicon substrate including the trench and the reverse spacers and removing some part of the second oxide layer and the polysilicon layer to form a gate;
   implanting ions into the silicon substrate at both sides of the gate to form pocket-well and LDD areas;
   depositing a nitride layer over the silicon substrate including the gate and etching the nitride layer to form spacers;
   implanting ions using the spacers and the gate as a mask to make a source/drain region; and
   forming a silicide layer on the top of the gate electrode and the silicon epitaxial layer positioned on the source/drain region.

2. The method as defined by claim 1, wherein the reverse spacers are formed on the sidewalls of the trench by dry-etching and are a layer of TEOS or a multi-layer of TEOS—SiN—TEOS.

3. The method as defined by claim 1, wherein the spacing between the reverse spacers defines the width of a gate channel.

4. The method as defined by claim 1, wherein the step of implanting ions to form pocket-well and LDD areas forms shallow junction by using ions at a high energy level.

5. The method as defined by claim 1, wherein the silicide layer formed on the silicon epitaxial layer which is positioned on the source/drain region functions as an elevated source/drain.

* * * * *